United States Patent
Yeh

(10) Patent No.: US 10,782,920 B2
(45) Date of Patent: Sep. 22, 2020

(54) DATA ACCESS METHOD, MEMORY STORAGE APPARATUS AND MEMORY CONTROL CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 25 days.

(21) Appl. No.: 16/186,584

(22) Filed: Nov. 12, 2018

(65) Prior Publication Data

US 2020/0097217 A1  Mar. 26, 2020

(30) Foreign Application Priority Data

Sep. 26, 2018 (TW) .............................. 107133916 A

(51) Int. Cl.
*G06F 3/06* (2006.01)
(52) U.S. Cl.
CPC .......... *G06F 3/0659* (2013.01); *G06F 3/0604* (2013.01); *G06F 3/0653* (2013.01); *G06F 3/0679* (2013.01)

(58) Field of Classification Search
CPC .... G06F 3/0659; G06F 3/0604; G06F 3/0653; G06F 3/0679
See application file for complete search history.

(56) References Cited

U.S. PATENT DOCUMENTS

| 2012/0134213 A1* | 5/2012 | Choi | ......................... | G11C 7/04 |
| | | | | 365/185.18 |
| 2015/0206569 A1* | 7/2015 | Bose | ......................... | A61H 3/00 |
| | | | | 365/158 |

* cited by examiner

Primary Examiner — Mohammed A Bashar
(74) Attorney, Agent, or Firm — JCIPRNET

(57) ABSTRACT

A data access method, a memory storage apparatus and a memory control circuit unit are provided. The memory storage apparatus includes a rewritable non-volatile memory module and the memory control circuit unit for controlling the rewritable non-volatile memory module. The data access method includes: receiving an access command; detecting a temperature of the memory storage apparatus; determining whether the temperature of the memory storage apparatus is lower than a first threshold; if the temperature of the memory storage apparatus is lower than the first threshold, performing a dummy access command or adjusting an operating voltage. The data access method further includes performing the access command after the dummy access command is performed or the operating voltage is adjusted.

24 Claims, 5 Drawing Sheets

DATA ACCESS METHOD, MEMORY STORAGE APPARATUS AND MEMORY CONTROL CIRCUIT UNIT

CROSS-REFERENCE TO RELATED APPLICATION

This application claims the priority benefit of Taiwan application serial no. 107133916, filed on Sep. 26, 2018. The entirety of the above-mentioned patent application is hereby incorporated by reference herein and made a part of this specification.

BACKGROUND

Technical Field

The present invention relates to a data access method, a memory storage apparatus and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, a rewritable non-volatile memory module can operate normally at temperatures from −40° C. to 85° C. When the temperature is too high or the temperature is too low (e.g., higher than 85° C. or less than −40° C.), a write failure or a read failure may be occurred frequently. Especially in a rewritable non-volatile memory module having poor quality, a write failure or a read failure may be occurred more frequently when the temperature is too low.

In the conventional method, only when a temperature of a rewritable non-volatile memory module is too high, a thermal throttle is performed. For example, when the temperature is too high, the read/write frequency of the rewritable non-volatile memory module may be appropriately adjusted to reduce the temperature of the rewritable non-volatile memory module and prevent data loss and deterioration of the rewritable non-volatile memory module due to accumulated heat. In a case where the temperature of the rewritable non-volatile memory module is too low, no mechanism is provided to effectively increase the temperature of the rewritable non-volatile memory module. Therefore, operations of writing or reading of data may not be performed normally on a rewritable non-volatile memory module at a low temperature.

Based on the above, a mechanism for effectively increasing a temperature of a rewritable non-volatile memory module is needed, such that access operations can be performed normally.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data access method, a memory storage apparatus and a memory control circuit unit.

According to an exemplary embodiment, a data access method for a memory storage apparatus is provided. The memory storage apparatus has a rewritable non-volatile memory module and a memory control circuit unit for controlling the rewritable non-volatile memory module. The data access method includes: receiving an access command; detecting a temperature of the memory storage apparatus; determining whether the temperature of the memory storage apparatus is lower than a first threshold; and if the temperature of the memory storage apparatus is lower than the first threshold, performing a dummy access command or adjusting an operating voltage. The data access method further includes performing the access command after executing the dummy access command or adjusting the operating voltage.

According to an exemplary embodiment, a memory control circuit unit for a memory storage apparatus is provided. The memory storage apparatus has a rewritable non-volatile memory module. The memory control circuit unit includes a host interface, a memory interface, and a memory management circuit. The host interface is configured to couple to the host system. The memory interface is configured to couple to the rewritable non-volatile memory module. The memory management circuit is coupled to the host interface and the memory interface. The memory management circuit is configured to receive an access command, detect the temperature of the memory storage apparatus, and determine whether the temperature of the memory storage apparatus is lower than a first threshold. If the temperature of the memory storage apparatus is lower than the first threshold, the memory management circuit performs a dummy access command or adjusts an operating voltage. And, after performing the dummy access command or adjusting the operating voltage, the memory management circuit is further configured to perform the access command.

According to an exemplary embodiment, a memory storage apparatus is provided. The memory storage apparatus includes a connection interface unit, a rewritable non-volatile memory module, and a memory control circuit unit. The connection interface unit is configured to couple to the host system. The memory control circuit unit is coupled to the connection interface unit and the rewritable non-volatile memory module. The memory control circuit unit is configured to receive an access command, detect a temperature of the memory storage apparatus, and determine whether the temperature of the memory storage apparatus is lower than a first threshold. Additionally, the memory control circuit unit performs a dummy access command or adjusts an operating voltage if the temperature of the memory storage apparatus is lower than the first threshold. And, after performing the dummy access command or adjusting the operating voltage, the memory control circuit unit is further configured to perform the access command.

Based on the above, the data access method, the memory storage apparatus and the memory control circuit unit provided in the exemplary embodiments can perform one or more mechanisms for effectively increasing a temperature of a rewritable non-volatile memory module and then perform an access command issued by a host system when the temperature of the rewritable non-volatile memory module is lower than the first threshold.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF THE EMBODIMENTS

Figure 1:
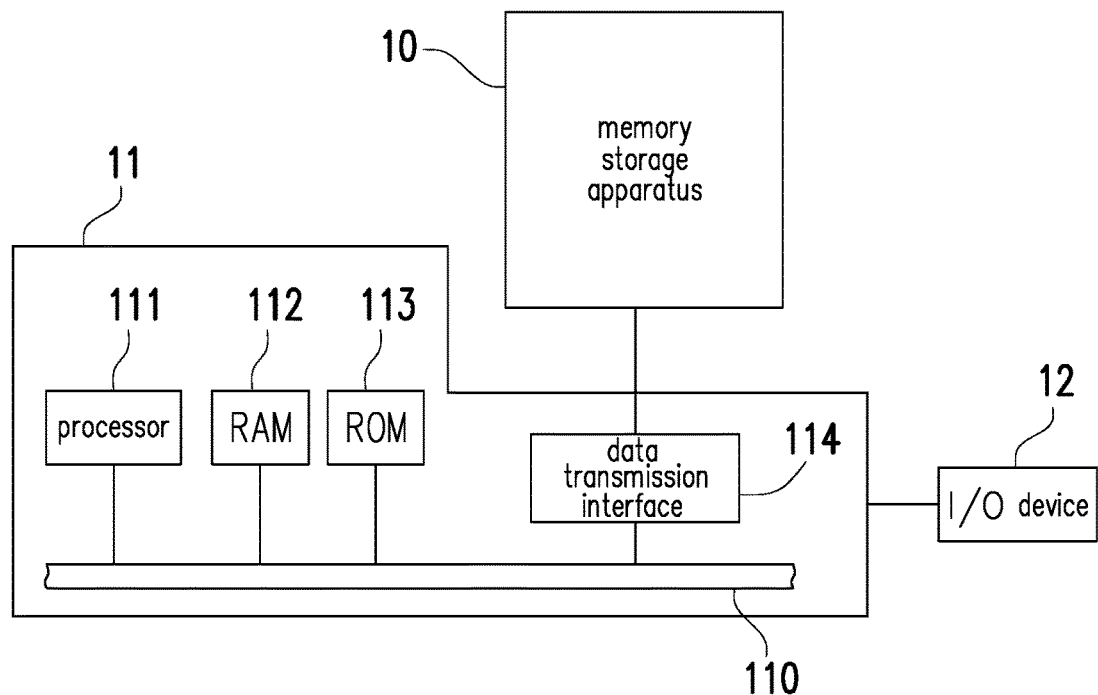
FIG. 1 is a schematic diagram illustrating a host system, a memory storage apparatus and an input/output (I/O) device according to an exemplary embodiment.

Reference will now be made in detail to the present preferred embodiments of the present disclosure, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage apparatus (i.e., a memory storage system) includes a rewritable non-volatile memory module and a controller (i.e., a control circuit unit). The memory storage apparatus is usually configured together with a host system so the host system can write data into the memory storage apparatus or read data from the memory storage apparatus.

Figure 2:
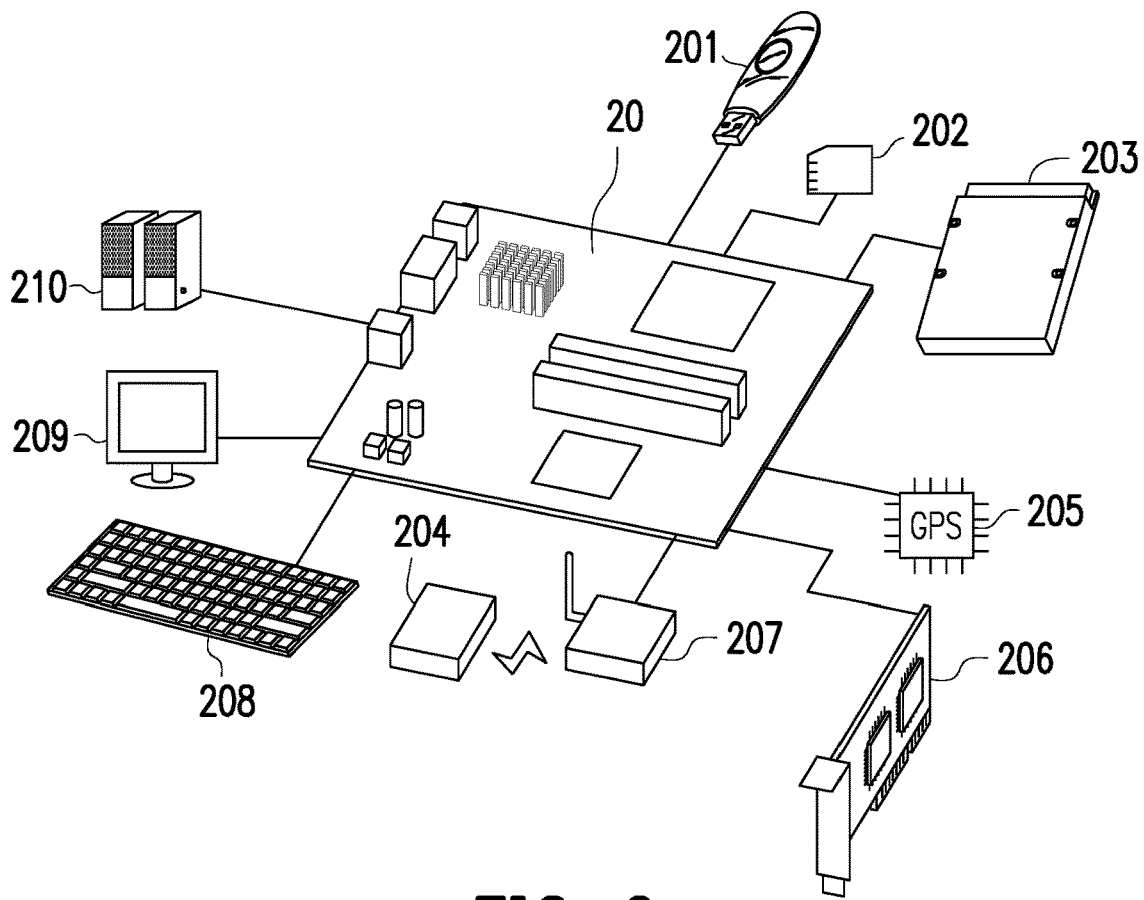
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a random access memory (RAM) 112, a read only memory (ROM) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 can write data into the memory storage apparatus 10 or read data from the memory storage apparatus 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 through the wireless transmission device 207.

Figure 3:
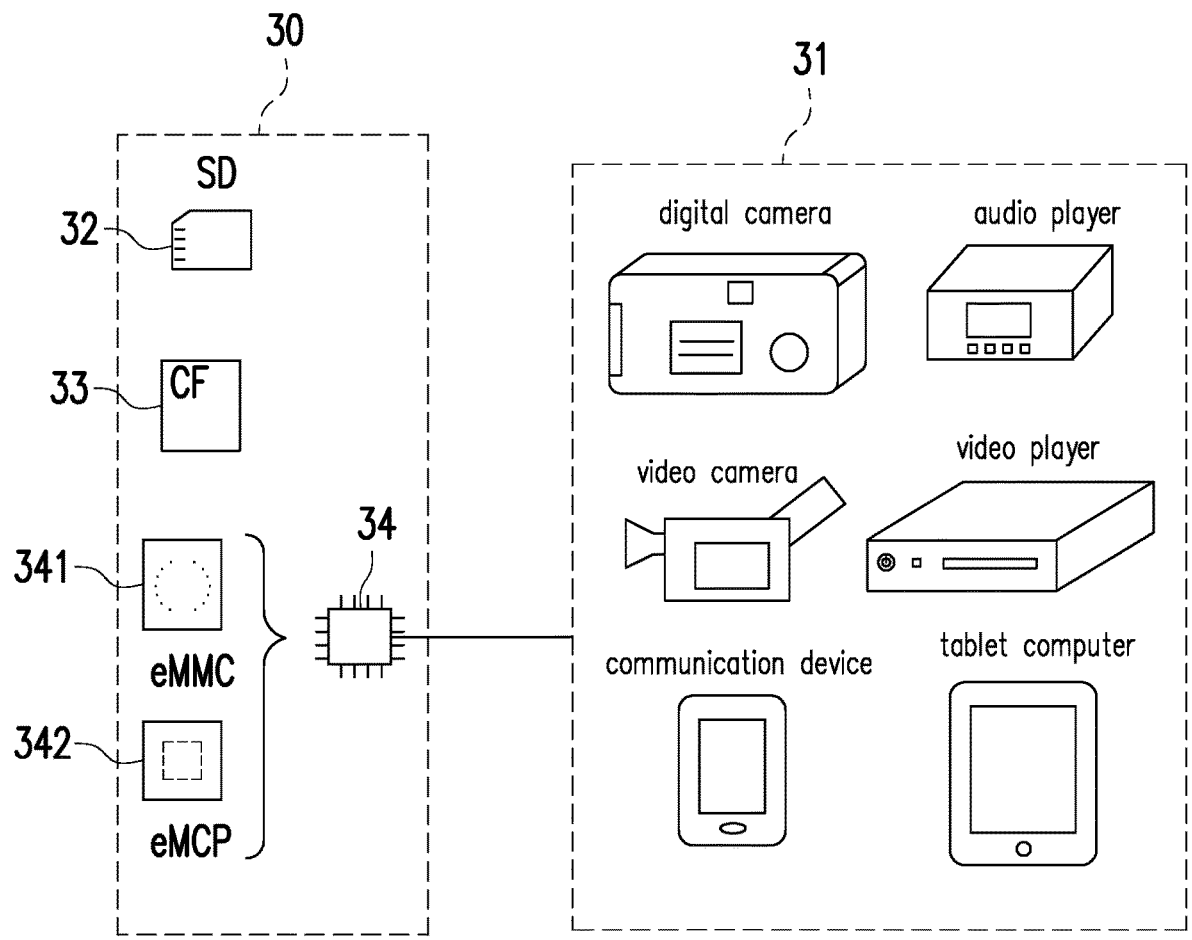
FIG. 3 is a schematic diagram illustrating a host system and a memory storage apparatus according to another exemplary embodiment.

In an exemplary embodiment, aforementioned host system may be any system capable of substantially cooperating with the memory storage apparatus for storing data. Although the host system is illustrated as a computer system in the foregoing exemplary embodiment, nonetheless, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage apparatus 34. The embedded storage apparatus 34 includes various embedded storage apparatuses capable of directly coupling a memory module onto a substrate of the host system, such as an eMMC (embedded MMC) 341 and/or an eMCP (embedded Multi Chip Package) 342.

Figure 4:
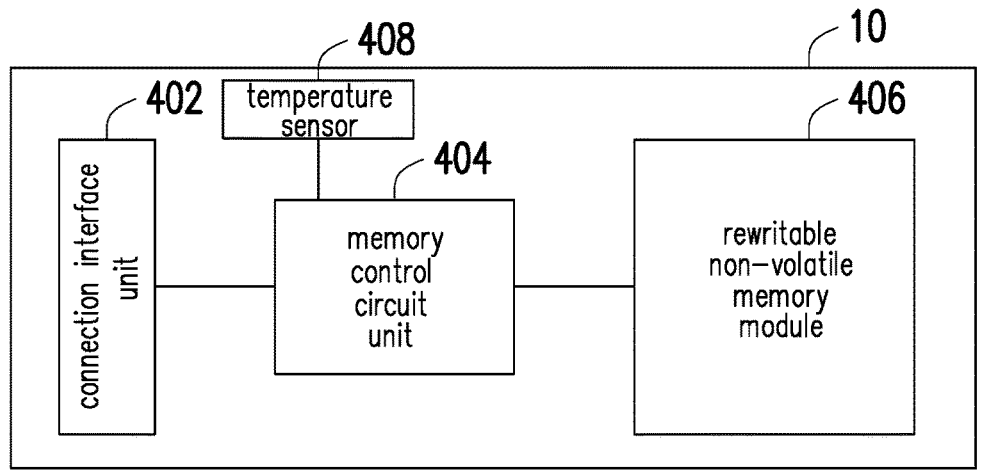
FIG. 4 is a schematic block diagram of a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a Secure Digital (SD) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

Each memory cell in the rewritable non-volatile memory module 406 stores one or more bits by changing a voltage (which is referred to as a threshold voltage hereinafter). Specifically, there is a charge trapping layer between a control gate and a channel of each memory cell. Through applying a writing voltage to the control gate, an amount of electrons in the charge trapping layer may be changed, so as to change the threshold voltage of each memory cell. This operation of changing the threshold voltage may also be referred to as "writing data to the memory cell" or "programming the memory cell". Along with the change of the threshold voltage, each memory cell in the rewritable non-volatile memory module 406 has a plurality of storage states. Which storage state a memory cell belongs to may be determined through applying a reading voltage, so as to obtain the one or more bits stored by each memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more physical programming units. If each memory cell is capable of storing two or more bits, the physical programming units on the same word line may be categorized into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is faster than a writing speed of the upper physical programming unit, or a reliability of the lower physical programming unit is higher than a reliability of the upper physical programming unit.

In the present exemplary embodiment, a physical programming unit is the smallest unit for programming. Namely, the physical programming unit is the smallest unit for writing data. For instance, the physical programming units may be physical pages or physical sectors. In case the physical programming units are the physical pages, each of the physical programming units usually includes a data bit area and a redundant bit area. The data bit area includes a plurality of physical sectors for storing user data, and the redundant bit area is configured for storing system data (e.g., management data, such as error correcting codes). In the present exemplary embodiment, each data bit area contains 32 physical sectors, and a size of each physical sector is 512 bytes. However, in other exemplary embodiments, the data bit area may contain 8, 16, or a greater or a smaller number of physical sectors, and the size of each physical sector may be greater or smaller. On the other hand, a physical erasing unit is the smallest unit for erasing. Namely, each physical erasing unit has the least number of memory cells to be erased altogether. For instance, the physical erasing unit is a physical block.

The temperature sensor 408 is coupled to the memory control circuit unit 404 for detecting the temperature of the memory storage apparatus 10. In an exemplary embodiment, the temperature sensor 408 can be disposed close to the highest heat source in the memory storage apparatus 10, such as close to the rewritable non-volatile memory module 406. But the present invention is not limited thereto.

Figure 5:
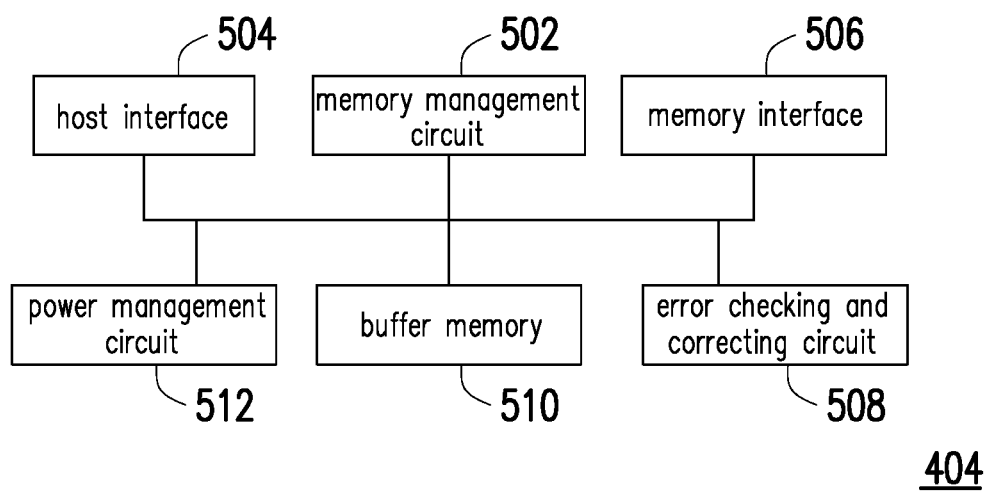
FIG. 5 is a schematic block diagram of a memory control circuit unit according to an exemplary embodiment.

FIG. 5 is a schematic block diagram of a memory control circuit unit according to an exemplary embodiment.

Referring to FIG. 5, the memory control circuit unit 404 includes a memory management circuit 502, a host interface 504, a memory interface 506 and an error checking and correction circuit 508.

The memory management circuit 502 is configured to control the overall operation of the memory control circuit unit 404. Specifically, the memory management circuit 502 has a plurality of control commands, and when the memory storage apparatus 10 is in operation, the control commands are executed to perform operations, such as data writing, data reading, and data erasing. The operations of the memory management circuit 502, when being described below, are similar to the operations of the memory controlling circuit unit 404.

In the present exemplary embodiment, the control commands of the memory management circuit 502 are implemented in a firmware form. For instance, the memory management circuit 502 has a microprocessor unit (not shown) and a read-only memory (not shown), and the control commands are burnt into the read-only memory. When the memory storage device 10 is in operation, the control commands are executed by the microprocessor unit to perform data operations, such as data writing, data reading and data erasing.

In another exemplary embodiment, the control commands of the memory management circuit 502 may also be stored in a specific area (e.g., a system area in the memory module exclusively used for storing the system data) of the rewritable non-volatile memory module 406 as program codes. Moreover, the memory management circuit 502 has a microprocessor unit (not shown), a read-only memory (not shown), and a random access memory (not shown). Specifically, the read-only memory has a boot code, and when the memory controller 404 is enabled, the microprocessor unit first executes the boot code to load the control commands stored in the rewritable non-volatile memory module 406 into the random access memory of the memory management circuit 502. Afterwards, the microprocessor unit executes the control commands for data operations, such as data writing, data reading and data erasing.

Additionally, in another exemplary embodiment, the control commands of the memory management circuit 502 may also be implemented in a hardware form. For example, the memory management circuit 502 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage memory cells of the rewritable non-volatile memory module 406 or groups thereof. The memory writing circuit is configured to issue a write command sequence to the rewritable non-volatile memory module 406 to write data to the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process data to be written to the rewritable non-volatile memory module 406 or data read from the rewritable non-volatile memory module 406. Each of the write command sequence, the read command sequence and the erase command sequence may include one or a plurality of program codes or instruction codes and may be configured to instruct the rewritable non-volatile memory module 406 to perform corresponding writing, reading and erasing operations. In an exemplary embodiment, the memory management circuit 502 may also issue other types of command sequences to the rewritable non-volatile memory module 406 to instruct it to perform corresponding operations.

The memory management circuit 502 may logically group a plurality of physical units of the rewritable non-volatile memory module 406 to a storage area and a replacement area. The physical units in the storage area are configured to store data, while the physical units in the replacement area are configured to replace damaged physical units in the storage area. For example, if data read from one of the physical units includes too many errors and is thus not correctable, the physical unit may be considered as a damaged physical unit. It should be noted that if there is no physical unit available in the replacement area, the memory management circuit 502 may declare that the whole memory storage device 10 enters a write protect state where no further data is allowed to be written to the memory storage device 10.

In the present exemplary embodiment, each physical unit refers to a physical erasing unit. However, in another exemplary embodiment, a physical unit may also refer to a physical address, a physical programming unit, or a combination of a plurality of continuous or discontinuous physical addresses. The memory management circuit 502 may assign a plurality of logical units to map the physical units in the storage area. In the present exemplary embodiment, each logical unit refers to a logical address. However, in another exemplary embodiment, a logical unit may also refer to a logical programming unit, a logical erasing unit or be composed of a plurality of continuous or discontinuous logical addresses. In addition, each of the logical units may be mapped to one or more physical units.

The memory management circuit 502 records a mapping relationship between the logical units and the physical units (which is also referred to as logical-physical address mapping information) in at least one logical-physical address mapping table. When the host system 11 is about to read data from the memory storage device 10 or write data to the memory storage device 10, the memory management circuit 502 may perform a data access operation on the memory storage device 10 according to the logical-physical address mapping table.

The host interface 504 is coupled to the memory management circuit 502 and configured to receive and identify commands and data transmitted by the host system 11. That is, the commands and the data transmitted by the host system 11 are transmitted to the memory management circuit 502 through the host interface 504. In the present exemplary embodiment, the host interface 504 complies with the SATA standard. However, it should be understood that the present invention is not limited thereto, and the host interface 504 may also comply with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard or other suitable standards for data transmission.

The memory interface 506 is coupled to the memory management circuit 502 and configured to access the rewritable non-volatile memory module 406. In other words, data to be written to the rewritable non-volatile memory module 406 is converted to an acceptable format for the rewritable non-volatile memory module 406 through the memory interface 506. Specifically, if the memory management circuit 502 is to access the rewritable non-volatile memory module 406, the memory interface 506 may transmit corresponding command sequences. For example, the command sequences may include a write command sequence instructing to write data, a read command sequence instructing to read data, an erase command sequence instructing to erase data, and other corresponding command sequences for instructing various memory operations (for example, changing a read voltage level, executing a garbage collection operation, or the like). These command sequences are generated by, for example, the memory management circuit 502 and transmitted to the rewritable non-volatile memory module 406 through the memory interface 506. These command sequences may include one or more signals or data on the bus. The signals or data may include instruction codes or program codes. For example, the read command sequence may include information, such as a read identification code, a memory address and so on.

The error checking and correcting circuit 508 is coupled to the memory management circuit 502 and configured to perform an error checking and correcting procedure to ensure data accuracy. To be specific, when the memory management circuit 502 receives a write command from the host system 11, the error checking and correcting circuit 508 generates an error correcting code (ECC) and/or error detecting code (EDC) corresponding to the write command for the data, and the memory management circuit 502 writes the data corresponding to the write command and the corresponding ECC and/or EDC to the rewritable non-volatile memory module 406. Subsequently, when reading the data from the rewritable non-volatile memory module 406, the memory management circuit 502 simultaneously reads the corresponding ECC and/or the EDC, and the error checking and correcting circuit 508 executes an error checking and correcting operation on the read data based on the ECC and/or the EDC. For descriptive convenience, the ECC and/or the EDC which are generated by the encoding operation are collectively referred to as an ECC.

In an exemplary embodiment, the memory control circuit unit 404 further includes a buffer memory 510 and a power management circuit 512.

The buffer memory 510 is coupled to the memory management circuit 502 and configured to temporarily store data and commands from the host system 11 or data from the rewritable non-volatile memory module 406. The power management circuit 512 is coupled to the memory management circuit 502 and configured to control the power of the memory storage device 10.

In the present exemplary embodiment, the error checking and correcting circuit 508 supports a low density parity check (LDPC) code. For example, the error checking and correcting circuit 508 may employ the LDPC code for coding and decoding. However, in another exemplary embodiment, the error checking and correcting circuit 508 may also support a BCH code, a convolutional code or a turbo code, which is not limited in the present invention.

It is noted that in the following description, some terms may be replaced with corresponding abbreviations for ease of reading (see Table 1).

TABLE 1

| memory control circuit unit | MCCU |
| rewritable non-volatile memory module | RNVM |
| physical programming unit | PPU |

In the present exemplary embodiment, the MCCU 404 may communicate with the temperature sensor 408 to get information for determining whether the temperature of the RNVM 406 itself, the surrounding of the RNVM 406 or the inside of the memory storage apparatus is lower than the first threshold (i.e., the predetermined temperature threshold, for example, −40° C.). For example, the MCCU 404 may communicate with the temperature sensor 408 to determine whether the temperature of the memory storage apparatus 10 is lower than the first threshold every when a certain number of control commands (e.g., reading, writing, and erasing, etc.) are performed, or for a certain period of time. Alternatively, the temperature sensor 408 may also issue an interrupt command when the temperature of the memory storage apparatus 10 is detected to be lower than the first threshold, so that the MCCU 404 gets the information indicating that the temperature of the memory storage apparatus 10 is below the first threshold. Obviously, the MCCU 404 may get the information for determining whether the temperature of the memory storage apparatus 10 is lower than the first threshold value in an active or passive manner.

Once the MCCU 404 determines that the temperature of the memory storage apparatus 10 is below the first threshold, the MCCU 404 performs a temperature rising operation, thereby increasing the temperature of the memory storage apparatus 10. Thus, the temperature of the memory storage apparatus 10 is increased to a safe temperature by a temperature rising operation and then the MCCU 404 can perform normally commands issued by the host system 11 on the RNVM 406. Herein, the safe temperature may not be lower than the first threshold for triggering the temperature rising operation).

In an exemplary embodiment, the MCCU 404 receives access commands from the host system 11, and the temperature sensor 408 continuously detects the temperature of the memory storage apparatus 10. When the temperature of the memory storage apparatus 10 is lower than the first threshold (for example, −40° C.), the MCCU 404 performs the temperature rising operation on the memory storage apparatus 10. After the temperature of the memory storage apparatus 10 is increased to the safe temperature, the MCCU 404 perform is the access commands issued by the host system 11. In the present exemplary embodiment, the temperature rising operation may include performing a dummy access command or adjusting an operating voltage of the memory storage apparatus 10. The present invention is not limited thereto.

In an exemplary embodiment, when the temperature sensor 408 detects that the temperature of the memory storage apparatus 10 is lower than the first threshold, the MCCU 404 may adjust the operating voltage of the memory storage apparatus 10 to increase the operating frequency of the MCCU 404 from a predetermined operating frequency to a first operating frequency, such that the temperature of the memory storage apparatus 10 gradually increases. When the temperature sensor 408 detects that the temperature of the memory storage apparatus 10 is increased to the safe temperature (i.e., the temperature of the memory storage apparatus 10 is not lower than the first threshold), the MCCU 404 restores the operating frequency of the MCCU 404 to the determined operating frequency. At this time, the temperature of the memory storage apparatus 10 has been increased to the safe temperature, and the MCCU 404 can perform normally commands issued by the host system 11 on the RNVM 406.

In another exemplary embodiment, when the temperature of the memory storage apparatus 10 still not increases after the operating frequency of the memory control circuit 404 is adjusted for a period of time which is determined based on the actual design requirement, the operation frequency of the memory control circuit 404 may be further adjusted from the first operation frequency to a second operating frequency larger than the first operating frequency. And, when the temperature of the memory storage apparatus 10 is increased to the safe temperature, the operating frequency of the MCCU 404 may be periodically/directly restored to the predetermined operating frequency from the second operating frequency. If the temperature of the memory storage apparatus 10 rises to the safe temperature after the operating frequency of the MCCU 404 is adjusted to the first operating frequency for the period of time, the operating frequency of the MCCU 404 is restored from the first operating frequency to the predetermined operating frequency.

Besides adjusting the operating frequency to increase the temperature of the memory storage apparatus 10, in another exemplary embodiment, when the temperature sensor 408 detects that the temperature of the memory storage apparatus 10 is lower than the first threshold, the MCCU 404 may also perform a dummy access command on the RNVM 406. Specifically, the MCCU 404 repeatedly performs the dummy access command (for example, a dummy read, a dummy write, etc.) on the RNVM 406. Thus, the MCCU 404 is in a busy state such that the temperature of the memory storage apparatus 10 gradually increases. After the temperature of the memory storage apparatus 10 rises to the safe temperature (that is, the temperature of the memory storage apparatus 10 is not lower than the first threshold), the MCCU 404 performs access commands issued by the host system 11 on the RNVM 406.

To be specific, the performing of the dummy access command includes performing a dummy read and/or a dummy write on the RNVM 406 to read data from the RNVM 406 and/or write data into the RNVM 406. In the exemplary embodiment, the performing of a dummy access command on the RNVM 406 means, for example, performing additional operations in a case where the host system 11 has no access requirements (for example, the MCCU 404 does not receive access commands issued by the host system 11 or the host system 11 does not issue access commands) or the MCCU 404 increases the temperature of the memory storage apparatus 10. For example, the operations include writing a predetermined data, a redundancy data, or a host command data to a bad physical block of the RNVM 406 or temporarily storing a redundancy data or a host command data in the buffer memory 510, which is not limited in the present invention. After the dummy access command is performed, the MCCU 404 may not return an access result to the host system 11.

Figure 6:
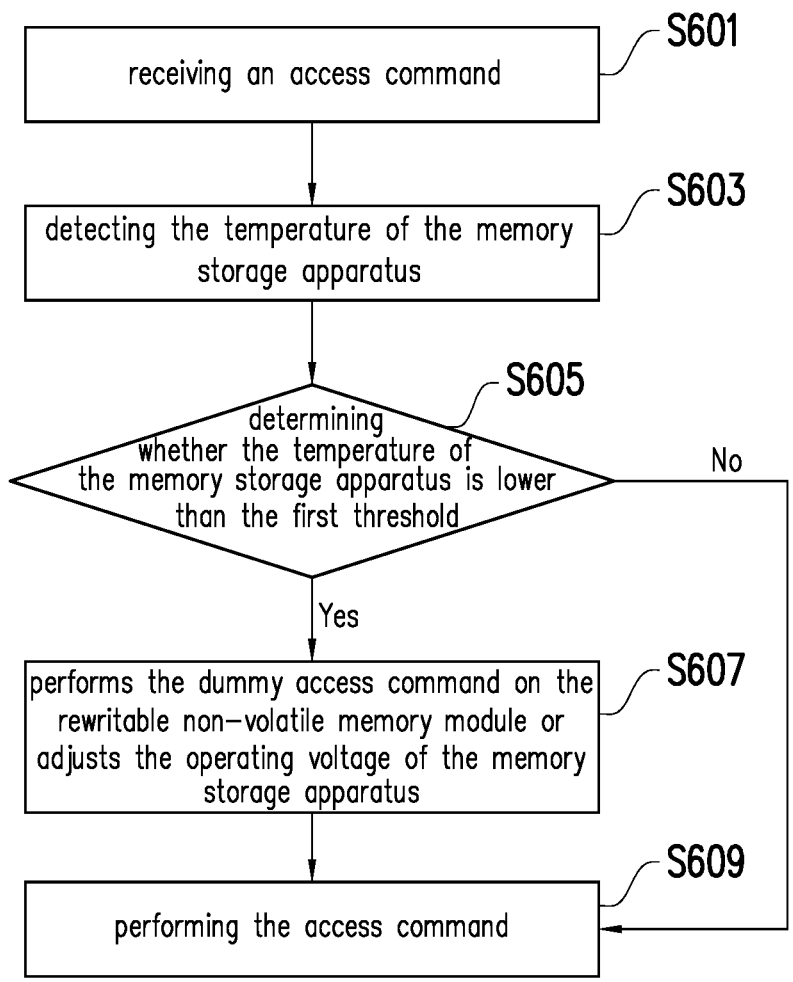
FIG. 6 is a flowchart of a data access method according to an exemplary embodiment.

FIG. 6 is a flowchart of a data access method according to an exemplary embodiment.

Referring to FIG. 6, in step S601, the MCCU 404 receives an access command issued by the host system 11.

In step S603, the temperature sensor 408 detects the temperature of the memory storage apparatus 10, and in step S605, the MCCU 404 determines whether the temperature of the memory storage apparatus 10 is lower than the first threshold.

If the MCCU 404 determines that the temperature of the memory storage apparatus 10 is lower than the first threshold, in step S607, the MCCU 404 performs the dummy access command on the RNVM 406 or adjusts the operating voltage of the memory storage apparatus 10 to increase the temperature of the memory storage apparatus 10. After the MCCU 404 performs the dummy access command on the RNVM 406 or adjusts the operating voltage of the memory storage apparatus 10, in step S609, the MCCU 404 performs the access command issued by the host system 11.

If the MCCU 404 determines that the temperature of the memory storage apparatus 10 is not lower than the first threshold, step S609 is performed directly.

Figure 7:
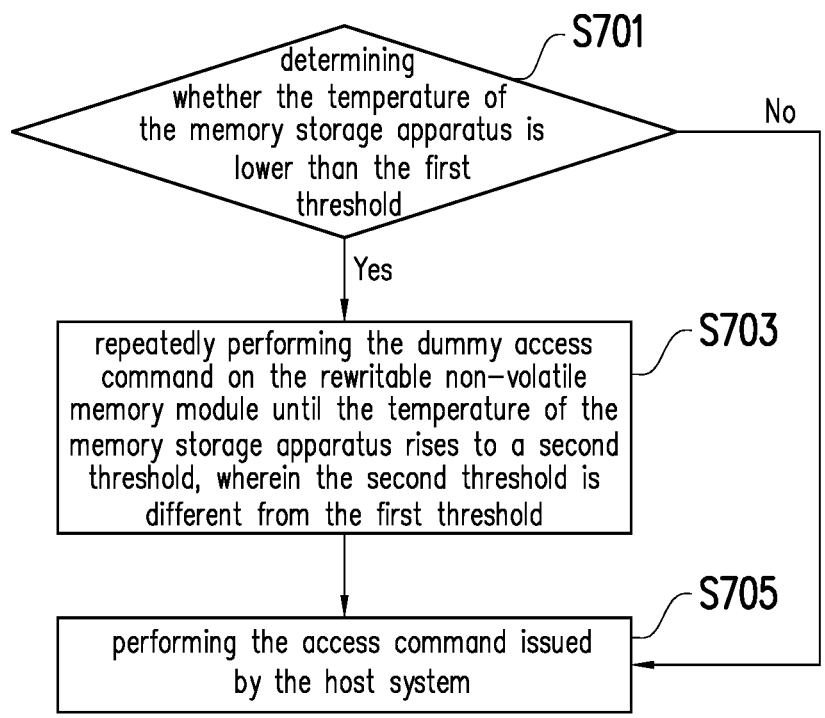
FIG. 7 is a flowchart of a data access method according to another exemplary embodiment.

FIG. 7 is a flowchart of a data access method according to another exemplary embodiment.

Referring to FIG. 7, in step S701, the MCCU 404 determines whether the temperature of the memory storage apparatus 10 is lower than the first threshold.

If the MCCU 404 determines that the temperature of the memory storage apparatus 10 is lower than the first threshold, in step S703, the MCCU 404 repeatedly performs the dummy access command on the RNVM 406 until the temperature of the memory storage apparatus 10 rises to a second threshold, wherein the second threshold is different from the first threshold. And, the temperature raised to the second threshold is a safe temperature not lower than the first threshold for triggering the temperature rising operation, and in step S705, the MCCU 404 performs the access command issued by the host system 11.

If the MCCU 404 determines that the temperature of the memory storage apparatus 10 is not lower than the first threshold, step S705 is performed directly.

In an exemplary embodiment, the MCCU 404 can perform the dummy access command on the RNVM 406 or adjust the operating voltage of the memory storage apparatus 10 to effectively increase the temperature of the memory storage apparatus 10. Additionally, the operations of performing the dummy access command or adjusting the operating voltage can be performed individually or in combination, or can be prioritized for performing, according to the actual design requirements. Of course, in addition to the above-mentioned several temperature rising operations, other temperature rising operations performed by the MCCU 404 of the memory storage apparatus 10 may be applied in the present invention, and the present invention is not limited thereto.

In summary, the data access method, the memory storage apparatus, and the MCCU in the exemplary embodiments are capable of performing the dummy access command on the RNVM 406 or adjusting the operating voltage of the memory storage apparatus 10 to increase the temperature of the memory storage apparatus 10 when the temperature is lower than the first threshold, and performing an access command from the host system 11 after the temperature of the memory storage apparatus 10 is increased to the safe temperature. Moreover, the data access method in the exemplary embodiment is implemented with the original structure of the memory storage apparatus, and the temperature of the memory storage apparatus can be increased without adding another structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data access method for a memory storage apparatus, wherein the memory storage apparatus has a rewritable non-volatile memory module and a memory control circuit unit controlling the rewritable non-volatile memory, the data access method comprising:
receiving an access command;
detecting a temperature of the memory storage apparatus;
determining whether the temperature of the memory storage apparatus is lower than a first threshold;
performing at least one operation of performing a dummy access command and adjusting an operating voltage if the temperature of the memory storage apparatus is lower than the first threshold, wherein the dummy access command comprises a dummy read command that is configured to perform a dummy read on the rewritable non-volatile memory module to read data from the rewritable non-volatile memory module; and
performing the access command after at least one operation of the dummy command is performed and the operating voltage is adjusted.

2. The data access method according to claim 1, wherein the step of performing the dummy command comprises:
repeatedly performing the dummy access command until the temperature of the memory storage apparatus rises to a second threshold if the temperature of the memory storage apparatus is lower than the first threshold,
wherein the second threshold is different from the first threshold.

3. The data access method according to claim 1, wherein the step of adjusting the operating voltage comprises:

adjusting an operating frequency of the memory control circuit unit from a predetermined operating frequency to a first operating frequency; and restoring the operating frequency of the memory control circuit to the predetermined operating frequency when the temperature of the memory storage apparatus rises to a safe temperature.

4. The data access method according to claim 1, wherein the step of performing the dummy command further comprises:

repeatedly performing the dummy read for several times.

5. The data access method according to claim 1, wherein the step of performing the dummy command further comprises:

performing a dummy write on the rewritable non-volatile memory module to program data to the rewritable non-volatile memory module.

6. The data access method according to claim 5, wherein the step of performing the dummy command further comprises:

repeatedly performing the dummy write for several times.

7. The data access method according to claim 1, wherein the dummy access command configured to perform a read operation or a program operation on the rewritable non-volatile memory module, and the read operation and the program operation are not indicated by a host system.

8. The data access method according to claim 1, wherein the dummy access command is configured to program data into a bad physical block or a predetermined area of the rewritable non-volatile memory modules.

9. A memory control circuit for a memory storage apparatus, wherein the memory storage apparatus has a rewritable non-volatile memory module, the memory control circuit comprising:

a host interface configured to couple to a host system;
a memory interface configured to the rewritable non-volatile memory module;
a memory management circuit coupled to the host interface and the memory interface,
wherein the memory management circuit is configured to receive an access command,
wherein the memory management circuit detects a temperature of the memory storage apparatus and determines whether the temperature of the memory storage apparatus is lower than a first threshold,
wherein the memory management circuit performs at least one operation of performing a dummy access command and adjusting an operating voltage if the temperature of the memory storage apparatus is lower than the first threshold, and performs the access command after the dummy command is performed or the operating voltage is adjusted, wherein the dummy access command comprises a dummy read command that is configured to perform a dummy read on the rewritable non-volatile memory module to read data from the rewritable non-volatile memory module.

10. The memory control circuit according to claim 9, wherein the memory management circuit repeatedly performs the dummy access command until the temperature of the memory storage apparatus rises to a second threshold if the temperature of the memory storage apparatus is lower than the first threshold, wherein the second threshold is different from the first threshold.

11. The memory control circuit according to claim 9, wherein in the operation of adjusting the operating voltage, the memory management circuit adjusts an operating frequency of the memory control circuit unit from a predetermined operating frequency to a first operating frequency, and the memory management circuit restores the operating frequency of the memory control circuit to the predetermined operating frequency when the temperature of the memory storage apparatus rises to a safe temperature.

12. The memory control circuit according to claim 9, wherein in the operation of performing the dummy command, the memory management circuit further repeatedly perform the dummy read for several times.

13. The memory control circuit according to claim 9, wherein in the operation of performing the dummy command, the memory management circuit further performs a dummy write on the rewritable non-volatile memory module to program data to the rewritable non-volatile memory module.

14. The memory control circuit according to claim 13, wherein in the operation of performing the dummy command, the memory management circuit further repeatedly performs the dummy write for several times.

15. The memory control circuit according to claim 9, wherein the dummy access command configured to perform a read operation or a program operation on the rewritable non-volatile memory module, and the read operation and the program operation are not indicated by the host system.

16. The memory control circuit according to claim 9, wherein the dummy access command is configured to program data into a bad physical block or a predetermined area of the rewritable non-volatile memory modules.

17. A memory storage apparatus, comprising:

a connection interface unit configured to couple to a host system;
a rewritable non-volatile memory module; and
a memory control circuit unit coupled to the connection interface unit and the rewritable non-volatile memory module,
wherein the memory control circuit unit is configured to receive an access command,
wherein the memory control circuit unit detects a temperature of the memory storage apparatus and determines whether the temperature of the memory storage apparatus is lower than a first threshold,
wherein the memory control circuit unit performs at least one of performing a dummy access command and adjusting an operating voltage if the temperature of the memory storage apparatus is lower than the first threshold, and performs the access command after the dummy command is performed or the operating voltage is adjusted, wherein the dummy access command comprises a dummy read command that is configured to perform a dummy read on the rewritable non-volatile memory module to read data from the rewritable non-volatile memory module.

18. The memory storage apparatus according to claim 17, wherein the memory control circuit unit repeatedly performs the dummy access command until the temperature of the memory storage apparatus rises to a second threshold if the temperature of the memory storage apparatus is lower than the first threshold, wherein the second threshold is different from the first threshold.

19. The memory storage apparatus according to claim 17, wherein in the operation of adjusting the operating voltage, the memory control circuit unit adjusts an operating frequency of the memory control circuit unit from a predetermined operating frequency to a first operating frequency, and the memory control circuit unit restores the operating frequency of the memory control circuit to the predetermined operating frequency when the temperature of the memory storage apparatus rises to a safe temperature.

20. The memory storage apparatus according to claim 17, wherein in the operation of performing the dummy command, the memory control circuit unit further repeatedly perform the dummy read for several times.

21. The memory storage apparatus according to claim 17, wherein in the operation of performing the dummy command, the memory control circuit unit further performs a dummy write on the rewritable non-volatile memory module to program data to the rewritable non-volatile memory module.

22. The memory storage apparatus according to claim 21, wherein in the operation of performing the dummy command, the memory control circuit unit further repeatedly performs the dummy write for several times.

23. The memory storage apparatus according to claim 17, wherein the dummy access command configured to perform a read operation or a program operation on the rewritable non-volatile memory module, and the read operation and the program operation are not indicated by the host system.

24. The memory storage apparatus according to claim 17, wherein the dummy access command is configured to program data into a bad physical block or a predetermined area of the rewritable non-volatile memory modules.

* * * * *